(12) United States Patent
Acar et al.

(10) Patent No.: US 8,373,508 B2
(45) Date of Patent: Feb. 12, 2013

(54) POWER AMPLIFIER

(75) Inventors: Mustafa Acar, Eindhoven (NL); Mark Pieter van der Heijden, Den Bosch (NL); Melina Apostolidou, Enschede (NL); Jan Sophia Vromans, Maastricht (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 13/141,719

(22) PCT Filed: Nov. 30, 2009

(86) PCT No.: PCT/IB2009/055406
§ 371 (c)(1),
(2), (4) Date: Jun. 23, 2011

(87) PCT Pub. No.: WO2010/073155
PCT Pub. Date: Jul. 1, 2010

(65) Prior Publication Data
US 2011/0260791 A1    Oct. 27, 2011

(30) Foreign Application Priority Data
Dec. 24, 2008   (EP) .................... 08106034

(51) Int. Cl.
*H03F 3/04* (2006.01)
(52) U.S. Cl. ...................... 330/302; 330/277
(58) Field of Classification Search .............. 330/302, 330/277, 305, 306
See application file for complete search history.

(56) References Cited

U.S. PATENT DOCUMENTS

| | | | | |
|---|---|---|---|---|
| 3,716,730 A | * | 2/1973 | Cerny, Jr. ................ | 327/113 |
| 4,849,710 A | * | 7/1989 | Vo ............................ | 330/277 |
| 5,406,224 A | * | 4/1995 | Mikami et al. ........... | 330/277 |
| 5,412,235 A | * | 5/1995 | Nakajima et al. ......... | 257/272 |
| 5,455,968 A | | 10/1995 | Pham | |
| 6,392,488 B1 | | 5/2002 | Dupuis et al. | |
| 7,489,194 B2 | * | 2/2009 | Hajimiri et al. .......... | 330/277 |
| 7,855,605 B1 | * | 12/2010 | Chang ...................... | 330/311 |
| 7,944,305 B2 | * | 5/2011 | Knickerbocker et al. .... | 330/277 |
| 2004/0000952 A1 | | 1/2004 | Lautzenhiser et al. | |
| 2005/0046459 A1 | | 3/2005 | Heedley et al. | |

FOREIGN PATENT DOCUMENTS

EP  1 734 653 A1  12/2006
WO  98/37627 A1   8/1998

OTHER PUBLICATIONS

Sokal, N., et al. "Computer Program for Fast Simulation and Optimization of Single-Ended Inductor-Fed Zero-Voltage-Switching Series-Resonant DC/DC Converters and DC/AC Inverters With Any Loading Topology", Proc. 4$^{th}$ Annual IEEE Applied Power Electronics Conf., pp. 303-314 (Mar. 13, 1989).

Grzesik, B., et al. "1MHz Sinusoidal Gate Driver for Class DE Inve4ter Operating with Variable Load and Frequency", 31$^{st}$ IEEE Power Electronics Specialists Conf., vol. 2, pp. 817-822 (Jun. 2000).

(Continued)

*Primary Examiner* — Henry Choe

(57) ABSTRACT

A pre-driver for an amplifier comprising a load network in which the following elements are connected in the following order: a resistor-an inductor-a capacitor. Also described are a power amplifier comprising such a pre-driver, a method of fabricating a pre-driver for an amplifier, and a method of performing power amplification.

12 Claims, 4 Drawing Sheets

OTHER PUBLICATIONS

Sowlati, T., et al. "A 2.4 GHz 0.18 μm CMOS Self-Biased Cascode Power Amplifier with 23dBm Output Power", IEEE Int'l. Solid-State Circuits Conf., Session 17, No. 17.5, 3 pgs. (2002).

Mazzanti, A., et al. "Analysis of Reliability and Power Efficiency in Cascode Class E PAs", IEEE J. of Solid-state Circuits, vol. 41, No. 5, pp. 1222-1229 (May 2006).

Mandegaran, S., et al. "A Breakdown Voltage Multiplier for High Voltage Swing Drivers", IEEE J. of Solid-State Circuits, vol. 42, No. 2, pp. 302-312 (Feb. 2007).

Yamomoto, S., et al. "High Efficiency GaAs Power MMIC Operating with a Single 3.0 V Supply for PACS Handsets", IEEE MTT-S Symposium on Techns. for Wireless Applications, pp. 33-36 (Feb. 2007).

Acar, M. et al. "Variable-Voltage Class-E Power Amplifiers", IEEE/MTT-S Int'l. Microwave Symposium, pp. 1095-1098 (Jun. 2007).

International Search Report and Written Opinion for Int'l Patent Application No. PCT/IB2009/055406 (May 28, 2010).

* cited by examiner

BACKGROUND

BACKGROUND

POWER AMPLIFIER

The present invention relates to RF power amplifiers. The present invention is particularly suited to, but not limited to, pre-drivers of RF power amplifiers.

A RF power amplifier chain is usually composed of a power stage amplifier, which is driven by a pre-driver. For cost and integration reasons there have been extensive attempts to use mainstream digital CMOS technology for all RF power amplifier chain building blocks. However, the very low breakdown voltage of mainstream CMOS technology does not allow the realisation of the power stage amplifier of the power amplifier in CMOS technology. Using a low voltage generally requires stepping down the antenna impedance to extremely small values. This increases the matching network losses in the amplifier. Therefore, the power stage amplifier of an RF power amplifier chain is usually implemented in other technologies, such as GaAs and GaN technology. These technologies can withstand higher voltages than CMOS technology while operating at RF frequencies.

The driving signal swing needed for the transistor technology of power stage amplifiers is high compared to voltage levels used in CMOS technologies. Therefore, a pre-driver is required to connect CMOS to the power stage amplifier. The pre-driver is required to provide a very high swing voltage with enough power to drive the power stage amplifier while consuming as small power as possible.

FIG. 1 is a schematic illustration of a CMOS device linked to a GaN power stage amplifier via a bondwire. The parasitic inductance introduced through such bondwires must be considered in order to avoid mismatch that results in power loss.

It is a very challenging task to design pre-drivers in today's CMOS technology to drive power transistors.

One of the common methods to obtain high voltage swing is to use cascoding. However, cascoding decreases efficiency due to the parasitic capacitances of the devices. A high bias voltage is needed in comparison to a single device approach. Also, extra circuitry is needed to bias the gates of the transistors in order to protect them against oxide breakdown.

Class-E power amplifiers are well-known. Switching losses in Class-E power amplifiers are eliminated. Thus, Class-E power amplifiers are highly efficient. FIG. 2 is a schematic illustration of a typical Class-E amplifier 100. The typical Class-E amplifier comprises a load network. The load network comprises an inductor $L_0$, a capacitor $C_0$ and a resistor R, which are connected in the following order: inductor $L_0$-capacitor $C_0$-resistor R. The loaded quality factor (QL) of a Class-E power amplifier is chosen around 4-5 in order to eliminate higher harmonics in standard telecommunication applications (e.g. GSM). The following relation holds between QL and load network circuit elements, $(QL=1/(\omega*R*C_0)=(\omega*L_0)/R)$.

The present inventors have realised it would be desirable to enable mainstream digital CMOS technology to be used efficiently in the power stage amplifier of an RF power amplifier chain.

The present inventors have realised it would be desirable to provide single pre-driver circuit in which both voltage multiplication and the elimination of the switching losses in a power amplifier transistor are possible.

The present inventors have further realised it would be beneficial to provide pre-driver circuitry that can be used to drive much higher voltages than its supply voltage.

In a first aspect, the present invention provides a pre-driver for an amplifier comprising: a first resistor; a first inductor; and a first capacitor; wherein a first terminal of the first resistor is connected to a first terminal of the first inductor; and a second terminal of the first inductor is connected to a first terminal of the first capacitor.

The pre-driver may further comprise a switch, wherein: a second terminal of the first resistor is connected to a first side of the switch; and a second terminal of the first capacitor is connected to a second side of the switch.

The switch may be a transistor.

The pre-driver may further comprise: a second capacitor; a second resistor; and a biasing voltage supply; wherein a first terminal of the first resistor is connected to a second terminal of the second capacitor; a first terminal of the second resistor is connected to a second terminal of the first inductor; and a second terminal of the second resistor is connected to the biasing voltage supply. The pre-driver may further comprise a switch, wherein: a first terminal of the second capacitor is connected to a first side of the switch; and a second terminal of the first capacitor is connected to a second side of the switch. The switch may be a transistor.

The pre-driver may further comprise an amplifier output, wherein the amplifier output is connected to the second terminal of the first inductor.

The amplifier output may drive a power transistor.

The switch transistor may be supplied at its drain by a supply voltage; and in order to operate, the power transistor may require a drive signal at its gate with a swing voltage higher than said supply voltage.

In a further aspect, the present invention provides a power amplifier comprising a pre-driver according to any of the above aspects.

In a further aspect, the present invention provides a method of fabricating a pre-driver for an amplifier, the method comprising: providing a first resistor, a first inductor and a first capacitor; connecting a first terminal of the first resistor to a first terminal of the first inductor; and connecting a second terminal of the first inductor to a first terminal of the first capacitor.

The method may further comprise: providing a switch; connecting a second terminal of the first resistor to a first side of the switch; and connecting a second terminal of the first capacitor to a second side of the switch.

The switch may be a transistor.

The method may further comprise: providing a second capacitor, a second resistor, and a biasing voltage supply; connecting a first terminal of the first resistor to a second terminal of the second capacitor; connecting a first terminal of the second resistor to a second terminal of the first inductor; and connecting a second terminal of the second resistor to the biasing voltage supply.

In a further aspect, the present invention provides a method of performing power amplification, the method comprising using a pre-driver or a power amplifier according to the above aspects.

In a further aspect, the present invention provides a pre-driver for an amplifier comprising a load network in which the following elements are connected in the following order: a resistor-an inductor-a capacitor.

Embodiments of the present invention will now be described, by way of example, with reference to the accompanying drawings, in which.

Figure 3:
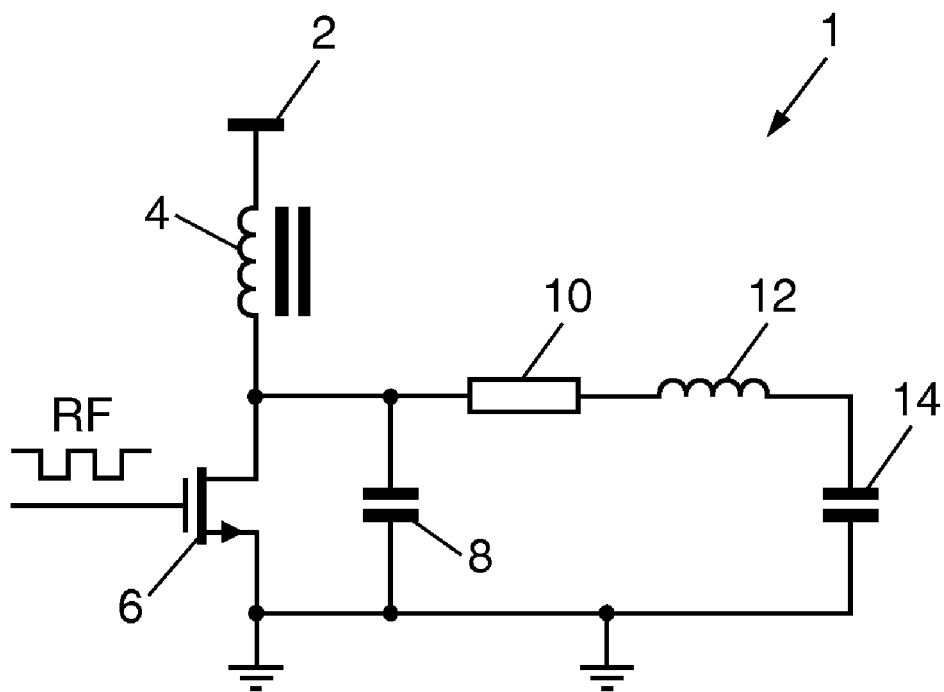
FIG. 3 is a schematic illustration of a modified Class-E amplifier according to a first embodiment of the invention.

FIG. 3 is a schematic illustration (not to scale) of a modified Class-E amplifier 1 according to a first embodiment of the invention. The modified Class-E amplifier 1 comprises a voltage supply 2, and a set of load networks, which comprises: a first inductor 4, a transistor 6, a first capacitor 8, a resistor 10, a second inductor 12 and a second capacitor 14.

The voltage supply supplies a voltage of 0.3V.

A first terminal of the first inductor 4 is connects to the voltage supply 2. A second terminal of the first inductor 4 is connected to a drain terminal of the transistor 6.

A gate terminal of the transistor 6 receives an RF input signal. The transistor 6 acts as a switch for the modified class-E amplifier 1. The transistor 6 is a thin oxide CMOS driver. The thin oxide has a gate-source oxide breakdown of 1.2V.

A first terminal of the first capacitor 8 is connected to the drain terminal of the transistor 6. The first terminal of the first capacitor 8 is connected to a first terminal of the resistor 10. A second terminal of the first capacitor 8 is connected to a source terminal of the transistor 6.

A first terminal of the resistor 10 is connected to the drain terminal of the transistor 6. A second terminal of the resistor 10 is connected to a first terminal of the second inductor 12.

A second terminal of the second inductor 12 is connected to a first terminal of the second capacitor 14.

A second terminal of the second capacitor 14 is connected to the source terminal of the transistor 6.

Figure 1:
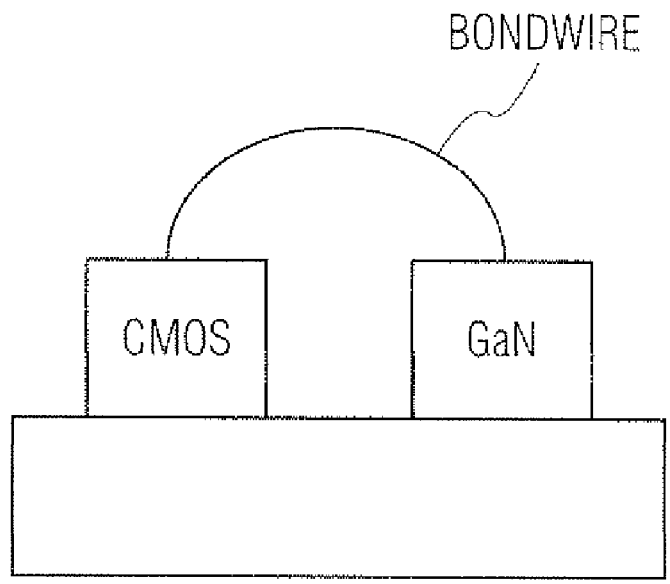
FIG. 1 is a schematic illustration of a CMOS device linked to a GaN power stage amplifier via a bondwire.
Figure 2:
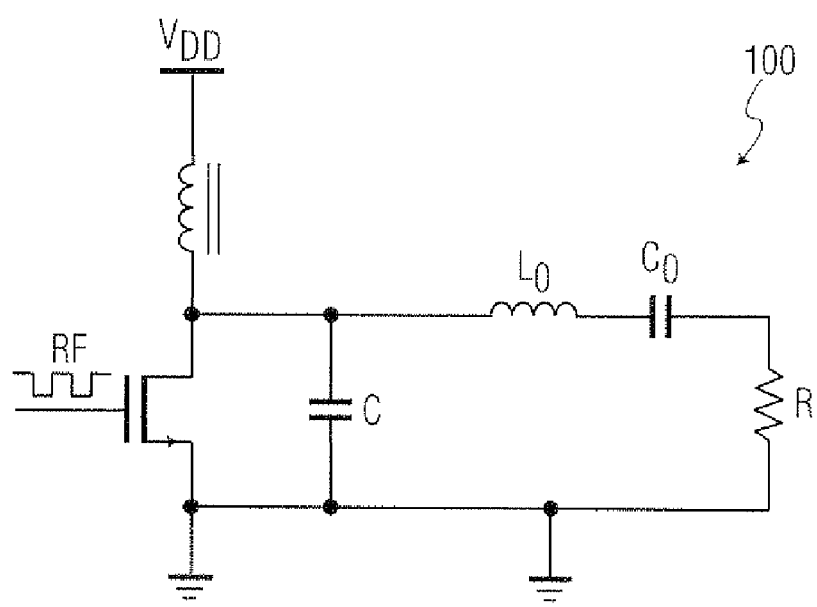
FIG. 2 is a schematic illustration of a typical Class-E amplifier.

The modified Class-E amplifier 1 comprises re-organised load networks with respect to the Class-E amplifier shown in FIG. 2. In particular the following elements are connected in the following order: resistor 10-second inductor 12-second capacitor 14. The load networks of the modified Class-E amplifier 1 are re-organised with respect to the Class-E amplifier shown in FIG. 2 such that the arrangement of load networks corresponds to the arrangement of load networks in the CMOS die connected to a GaN die through a bondwire, as shown in FIG. 1, where the bondwire is represented in the modified Class-E amplifier 1 by the second inductor 12, the input capacitance of the GaN transistor is represented in the modified Class-E amplifier 1 by the second capacitor 14, and the parasitic resistances arising from the interconnections present in FIG. 1 are represented in the modified Class-E amplifier by the resistor 10.

The re-organised load networks of the modified Class-E amplifier 1 have an advantage of enabling the modified Class-E amplifier 1 to be used in pre-driver circuitry that can drive higher voltages than its supply voltage. A further advantage is that switching losses on the pre-driver are eliminated because the Class-E conditions are preserved.

A load quality factor $Q_L$ of the load network (comprising an inductor $L_0$, a capacitor $C_0$ and a resistor R) of the Class-E power amplifier 100 can be adjusted to suppress higher harmonics. An advantage of the modified Class-E amplifier 1 is that if a high value is chosen for its load quality factor QL_MOD, the voltage seen at 28 will be significantly higher than the voltage supplied to the circuit from the voltage supply 2. Voltage$_{\_28}$~QL_MOD*VDD$_{\_2}$. The value of QL_MOD can be adjusted according to the voltage swing needed at 28. The chosen value of QL_MOD requires to adapt the values of the capacitor 26, inductor 12 and the resistor 10 for a certain operation frequency. (QL_MOD=1/($\omega$*R$_{\_10}$*C$_{\_26}$)=($\omega$*L$_{\_12}$)/R$_{\_10}$)

Figure 4:
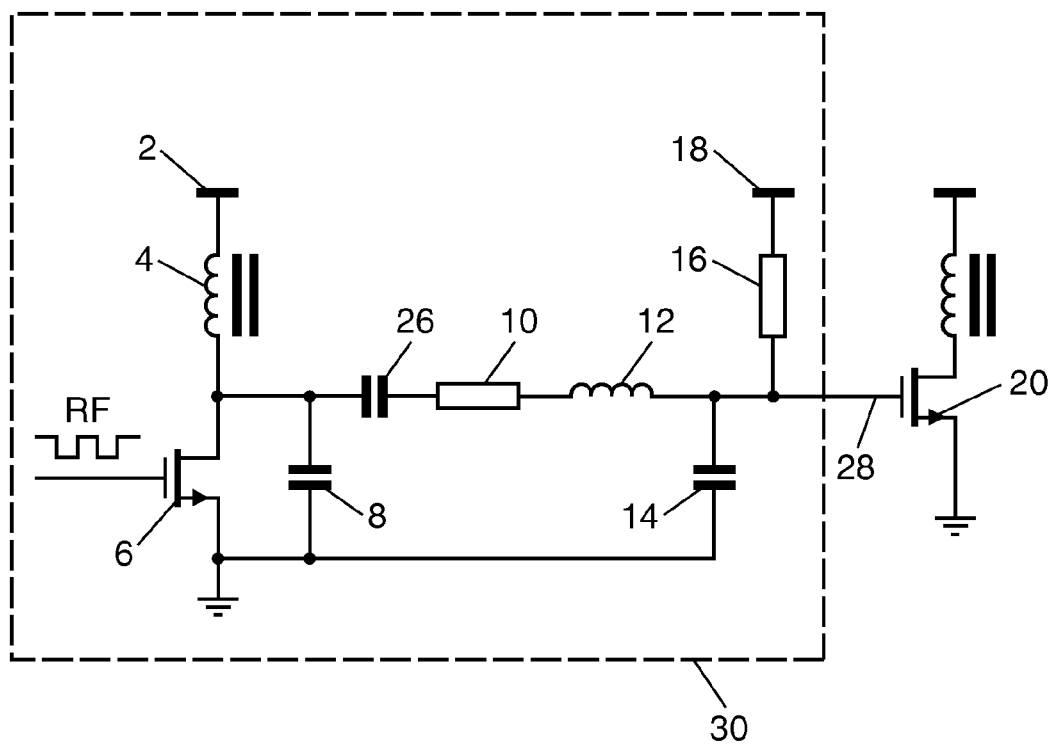
FIG. 4 is a schematic illustration (not to scale) of a modified Class-E pre-driver.

FIG. 4 is a schematic illustration (not to scale) of a modified Class-E pre-driver 30. The same reference numerals to those used in FIG. 3 has been used to represent the same elements.

The modified Class-E pre-driver 30 comprises those elements present in the modified Class-E amplifier and, in addition, a biasing resistor 16, and a third capacitor 26.

A first terminal of the biasing resistor 16 is connected to the second terminal of the second inductor 12 and the first terminal of the second capacitor 14. A second terminal of the biasing resistor 16 is connected to a biasing voltage 18.

A first terminal of the third capacitor 26 is connected to the drain terminal of the transistor 6. A second terminal of the third capacitor 26 is connected to the first terminal of the resistor 10.

An amplifier output 28 of the modified Class-E pre-driver 30 drives a power transistor 20. The power transistor 20 is a thick oxide CMOS inverter. The thick oxide of the power transistor 20 requires a drive signal with a swing voltage of 2.5V.

The biasing resistor 16 and the third capacitor 26 have an advantage of enabling the correct gate biasing of the gate of the power transistor 20.

The modified Class-E pre-driver 30 is able to use a small supply voltage to generate a much larger swing voltage. The modified Class-E pre-driver 30 is able to use a supply voltage of 0.3V to generate a swing voltage of 2.5V. this has an advantage of enabling a power transistor requiring a large swing voltage to be driven by a small supply voltage, for example, a supply voltage of 0.3V can drive a thick oxide CMOS inverter requiring a swing voltage of 2.5V.

An advantage of the above described modified Class-E amplifier 1 and modified Class-E pre-driver 30 is that low cost mainstream low breakdown transistors, for example, CMOS transistors, can be used to drive high voltage power transistors, i.e. using a low supply voltage it is possible to generate very high voltages.

A further advantage of the above described systems is that driving interface problems between CMOS technologies and other power transistor technologies may be overcome.

A further advantage of the above described systems are that transistor switching losses tend to be eliminated in the pre-drivers. This is because the new circuit topology described above is derived from the Class-E amplifier concept.

In the above embodiments the voltage supply 2 supplies a voltage of 0.3V. However, in other embodiments the voltage supply may supply a different appropriate voltage.

In the above embodiments, the transistor 6 is a thin CMOS oxide driver. However, in other embodiments the transistor 6 may a different appropriate type of driver.

In the above embodiments, the thin oxide of the transistor 6 has a gate-source oxide breakdown of 1.2V. However, in other embodiments the thin oxide may have a different appropriate gate-source oxide breakdown.

In the above embodiments, the power transistor 20 is a thick oxide inverter. However, in other embodiments the power transistor may be a different appropriate type of transistor.

In the above embodiments, the thick oxide of the power transistor 20 requires a drive signal with a swing voltage of 2.5V. However, in other embodiments the power transistor may require a drive signal with a different appropriate swing voltage.

It will be appreciated that, in the above embodiments, the provided modified Class-E amplifiers combine the concepts of voltage multiplication and the elimination of the switching losses in a power amplifier transistor, in a single pre-driver topology. Also, in addition to the advantages outlined above, the provided modified pre-drivers may be advantageously used in applications where power amplifiers are used, such as mobile phones and base-stations.

The invention claimed is:

1. A pre-driver for an amplifier comprising:
   a first resistor having a first terminal and a second terminal;
   a first inductor having a first terminal and a second terminal;
   a first capacitor having a first terminal and a second terminal;
   a second capacitor having a first terminal and a second terminal; and
   a switch having a first side and a second side, wherein the second terminal of the second capacitor is connected to the second terminal of the first resistor, the first terminal of the first resistor is connected to the first terminal of the first inductor, the second terminal of the first inductor is connected to the first terminal of the first capacitor, the first terminal of the second capacitor is connected to the first side of the switch, and the second terminal of the first capacitor is connected to the second side of the switch.

2. The pre-driver according to claim 1, further comprising:
   a second resistor having a first terminal and a second terminal; and
   a biasing voltage supply, wherein the second terminal of the first resistor is connected to the second terminal of the second capacitor, the first terminal of the second resistor is connected to the second terminal of the first inductor, and the second terminal of the second resistor is connected to the biasing voltage supply.

3. The pre-driver according to claim 1, wherein the switch is a transistor.

4. The pre-driver according to claim 3 further comprising: an amplifier output, wherein the amplifier output is connected to the second terminal of the first inductor.

5. The pre-driver according to claim 4, wherein the amplifier output drives a power transistor.

6. The pre-driver according to claim 5, wherein the switch transistor is supplied at its drain by a supply voltage and, in order to operate, the power transistor requires a drive signal at its gate with a swing voltage higher than said supply voltage.

7. A power amplifier comprising the pre-driver according to claim 1.

8. A method of fabricating a pre-driver for an amplifier, the method comprising:
   providing a first resistor having a first terminal and a second terminal, a first inductor having a first terminal and a second terminal, a first capacitor having a first terminal and a second terminal, a second capacitor having a first terminal and a second terminal; and a switch having a first side and a second side;
   connecting the second terminal of the second capacitor to the second terminal of the first resistor;
   connecting the first terminal of the first resistor to the first terminal of the first inductor;
   connecting the second terminal of the first inductor to the first terminal of the first capacitor;
   connecting the first terminal of the second capacitor to the first side of the switch; and
   connecting the second terminal of the first capacitor to the second side of the switch.

9. The method according to claim 8, further comprising:
   connecting the second terminal of the first resistor to the first side of the switch; and
   connecting the second terminal of the first capacitor to the second side of the switch.

10. The method according to claim 9, wherein the switch is a transistor.

11. The method according to claim 8, further comprising:
    providing a second resistor having a first terminal and a second terminal, and a biasing voltage supply;
    connecting the second terminal of the first resistor to the second terminal of the second capacitor;
    connecting the first terminal of the second resistor to the second terminal of the first inductor; and
    connecting the second terminal of the second resistor to the biasing voltage supply.

12. A method of performing power amplification, the method comprising using the pre-driver according to claim 1 or the power amplifier according to claim 7.

* * * * *